(12) United States Patent
Vanden Brande et al.

(10) Patent No.: US 6,432,281 B2
(45) Date of Patent: Aug. 13, 2002

(54) PROCESS FOR FORMATION OF A COATING ON A SUBSTRATE

(75) Inventors: Pierre Vanden Brande, Brussels; Stephane Lucas, Suarlee; Alain Weymeersch, Wavre, all of (BE)

(73) Assignee: Recherche et Developpement Due Groupe Cockerill Sambre, Liege (BE)

( * ) Notice: Subject to any disclaimer, the term of this patent is extended or adjusted under 35 U.S.C. 154(b) by 0 days.

(21) Appl. No.: 09/774,241

(22) Filed: Jan. 31, 2001

Related U.S. Application Data

(63) Continuation-in-part of application No. 08/764,025, filed on Dec. 11, 1996, now abandoned.

(30) Foreign Application Priority Data

Dec. 20, 1995 (BE) ............................................ 09501052

(51) Int. Cl.[7] ........................... C23C 14/00; C23C 14/34
(52) U.S. Cl. ............................ 204/192.15; 204/192.12; 204/298.24; 204/298.19; 204/298.09; 204/298.12; 427/571; 427/576; 427/587; 427/593
(58) Field of Search ....................... 204/192.12, 192.15, 204/192.17, 298.06, 298.08, 298.09, 298.12, 298.19, 298.24; 427/523, 531, 571, 576, 587, 593

(56) References Cited

U.S. PATENT DOCUMENTS 3,799,862 A * 3/1974 Krutenat ................. 204/298.06
5,507,931 A * 4/1996 Yang ....................... 204/192.15

FOREIGN PATENT DOCUMENTS

| BE | 1009838 A3 | 10/1997 |
| EP | 0685571 | * 12/1995 |
| EP | 0 780 486 A1 | 11/1996 |

* cited by examiner

*Primary Examiner*—Rodney G. McDonald
(74) *Attorney, Agent, or Firm*—Pillsbury Winthrop LLP

(57) ABSTRACT

A process for forming a coating on a substrate by condensation of a coating material onto the substrate while the substrate is moving through an enclosure under vacuum in which evaporation of the coating material takes place.

With the inventive process, deposits with controlled structure and adhesion can be made on moving substrate or support even at very high speeds, so that the process can advantageously be carried out continuously or at variable speed.

11 Claims, 1 Drawing Sheet

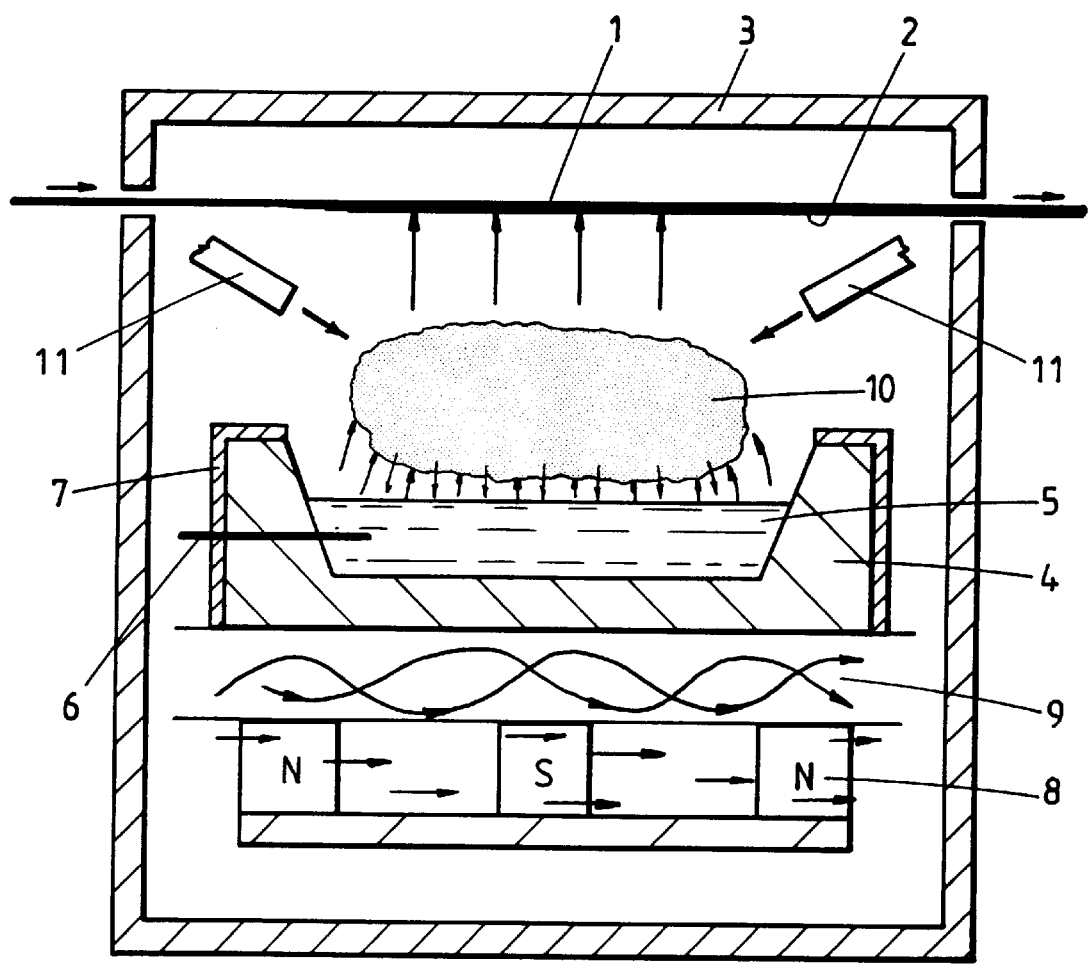

PROCESS FOR FORMATION OF A COATING ON A SUBSTRATE

This is a continuation-in-part National application Ser. No. 08/764,025 filed Dec. 11, 1996 now abandoned.

BACKGROUND OF THE INVENTION

1. Field of Invention

This invention concerns a process for forming a coating on a substrate by condensation of a coating material onto the substrate while the substrate is moving through an enclosure under vacuum in which evaporation of the coating material takes place.

2. Description of the Related Art

Evaporation processes are known to produce high deposition rate. Unfortunately evaporation exhibits in some cases adhesion, structure and homogeneity problems (especially for relatively considerable coating thickness).

Evaporation specialists know that the way to improve adhesion and structure is to heat the substrate.

Sputtering process is another way to coat substrates. This technique is well known to produce better adhesion, structure and homogeneity than pure evaporation has the drawback to have low deposition rate.

A low deposition rate must be avoided for most industrial use. For that reason evaporation on a heated substrate is the standard PVD process for "thick" coatings.

Each kind of substrate has its own upper process temperature in relation with its physical properties. Some substrates such as, for example, plastics, paper, and quenched steel, have very low process temperature and, as such, any improvement of adhesion by heating is not possible.

Krutenat described a process for the formation on a stationary substrate of a coating which includes in combination the technique of evaporation and condensation under vacuum with the technique of cathodic sputtering. It has been observed that by applying these two techniques simultaneously a mutual synergistic effect is produced and has the possible result of reducing the drawbacks exhibited by each of these techniques when used separately. Nevertheless, the Krutenat process still requires that the substrate be heated to ensure good structure and adhesion at any deposition rate.

SUMMARY OF THE INVENTION

A way to improve adhesion and structure without special substrate heating or special reduction of deposition rate.

A way to control and to maintain constant adhesion and structure even if high coating rate must be reached or if deposition rate must be modulated for external reason (for example: continuous coating line producing with the same tools different coating thicknesses at variable line speeds).

Under this invention, usage is made, within an enclosure, of a target exhibiting a superficial layer directed towards the substrate. The superficial layer contains a coating material precursor (or element). The coating is formed by evaporation followed by condensation while simultaneously cathodic sputtering the precursor from the target on the substrate.

According to this invention, adhesion and structure is maintained constant by controlling the ratio between the quantities of the precursor that are simultaneously evaporated and sputtered.

Because evaporation rate is physically controlled by target temperature and because sputtering rate is controlled by electrical discharge power density, this invention propose to regulate (with the lowest delay time) target temperature and plasma power density altogether in relation with aimed deposition rate and aimed structure and adhesion.

BRIEF DESCRIPTION OF THE DRAWING

Other details and particular features of the invention will emerge from the description given below, as an example without limiting effect, of a particular form of implementation of the invention with reference to annexed FIGURE, which diagrammatically represents a sectional view of a specific device for implementation of the inventive process.

DETAILED DESCRIPTION OF THE INVENTION

The present invention provides a continuous process for the formation of a coating on any moving substrate, the process including combination the technique of evaporation and condensation under vacuum, in itself known, with the technique of cathodic sputtering, again in itself known.

With the inventive process, deposits with controlled structure and adhesion can be made on moving substrate or support even at very high speeds, so that the process can advantageously be carried out continuously or at variable speed.

Advantageously the moving substrate can be submitted to temperature requirements and in some cases preferably under 220° C.

It has been observed that the ratio between evaporation and sputtered flow rates controls adhesion and structure of coating without extra substrate heating. Adhesion and high deposition rate are obtained when the ratio between evaporated and total flow rate lies between 50% and 98%.

Variation of the ratio evaporation/sputtering occurs when the deposition rate has to be changed.

The present invention provides a way to control separately target temperature (evaporation) and plasma power density (sputtering) to keep the ratio evaporation/sputtering constant for any deposition rate.

Under the invention and as illustrated by the figure, the substrate 1 to be covered with a preferably metallic coating is moved through an enclosure under vacuum 3 in which the evaporation and cathodic sputtering of the element forming the coating 2 take place.

Although the invention is not limited to the formation of a metallic coating, for ease of description, hereafter only a metal Will be mentioned as the precursor (or element) constituting the coating.

In the figure, the substrate 1 is formed on a metal sheet, specifically a steel sheet, continuously crossing the enclosure 3 according to the direction indicated by an arrow. The enclosure 3 comprises a target 4 exhibiting a superficial layer 5 directed towards the substrate 1 and containing the metal (in liquid state) that is to form the coating 2. This target 4 in practice preferably is a crucible containing the metal in liquid form. The crucible 4 is made of a material capable of resisting high temperatures in the region of 1000° C. to 1300° C. and which at these high temperatures does not chemically react with the element contained therein. The crucible 4 may be made of a material that does not conduct electricity, such as, for example, alumina, borium nitride, etc., or a material which does conduct electricity, such as, for example, carbon, molybdenum, tungsten, etc. Choice of this material is governed mainly by its properties of resistance in relation to the metal to be evaporated and sputtered.

If the crucible 4 is made of a nonconducting material, an input of current 6 must supply power to the metal to be evaporated. To the contrary, if the crucible 4 is made of an electricity conducting material, it can be supported mechanically by an input of current. However, even in the case of a crucible made of a conducting material, it may be preferable to use a current input 6 directly in contact with the metal to be evaporated and sputtered in order to ensure good electric contact, independently of thermal expansions. The side walls of a crucible made of a conducting material are advantageously insulated electrically by a screen 7 allowing formation, of a discharge (plasma) on the crucible sides, and hence cathodic sputtering on these side walls, to be avoided. The ratio between the quantities simultaneously evaporated and sputtered is regulated by controlling the target temperature and by varying simultaneously the plasma power density dissipated at the target. Plasma power density is very simply controlled by standard electrical generator for plasma discharge. Target temperature can be regulated by varying thermal conductivity between target and cooling system or by feeding the target with controlled preheated/precooled precursor or by any other means.

This thermal control enables the element, namely the metal, contained in the crucible 4 to reach sufficient temperatures for the vapor tension in the enclosure 3 to give rise to a process of evaporation under vacuum. In addition, the crucible 4 is located above a magnetic circuit 8, thus enabling a magnetron discharge having a direction parallel to the moving substrate. This circuit 8 is preferably supplied with direct current.

The circuit 8 is cooled by water circulating so as to keep the water at a temperature from 15° C. to 60° C., and preferably in the region of 20° C. to 90° C.

Thermal control of the crucible 4 illustrated hereafter is made by known techniques: regulation of thermal transfer by elements of constant or variable thermal conductivity insulation 9 located under the crucible 4, which allow the crucible temperature to be kept between 200° C. and 1500° C. The selected temperature will vary depending on the metal contained in the crucible 4. For example, for tin the temperature will be in the region of 1200° C. The temperature determines the vapor tension and hence the rate of evaporation of the metal.

Under a variation of the invention, the thermal control can comprise a conductive regulating fluid of the type described in document EP-A-95870065.

In order to cathodic sputter the liquid metal 5 contained in the crucible 4, the liquid metal 5 is kept at a negative potential in relation to the substrate 1, and plasma 10 is created in the vicinity of the level of this liquid metal 5 due to the presence of the magnetic circuit.

An inert gas, such as argon, is introduced into the enclosure 3 by injectors 11 preferably directed slantwise towards the plasma 10 and towards the liquid metal 5 contained in the crucible 4.

In this way, the gas is ionized and the ions thus formed bombard the surface of the liquid metal 5 and eject particles of the metal towards the moving substrate 1, which can so be maintained to a uniform temperature, preferably lower than 220° C., advantageously lower than 180° C.

Document EP-A-95870065.0 describes a cathodic sputtering process that is applicable within the framework of this invention by means of appropriate regulation of the crucible temperature in the way described above in order to obtain the required vapor tension of the metal above the crucible 4.

The rate of deposit of this metal on the substrate 1 is regulated, under the invention, by the joint regulating effect of the power density and the target temperature.

Under a particular embodiment of the process according to the present invention the discharge of plasma is kept in the vapor formed by the metal above the crucible 4. It has been established that in this case the inert gas flow projected into the plasma by the injectors 11 can be much reduced or even suppressed.

It has been found that a stable discharge can be obtained if the total pressure of the gas, consisting of the metal vapor and the inert gas, in the enclosure lies between 0.002 and 0.5 Torr.

The inventive process is mainly applicable with any metal to be evaporated and sputtered simultaneously for example tin, aluminum, zinc, chromium, magnesium, manganese and nickel.

The crucible 4 can, for example, be formed of graphite, alumina or molybdenum.

Set forth in the following non-limiting example are results of tests made with a device of the type represented in the annexed figure, in which the metal consisted of tin.

EXAMPLE

The substrate was formed of a steel sheet 0.25 mm thick, one of the faces of which was to be covered with a coating of tin.

Tests were conducted as follows:

A graphite crucible full of tin laid on a variable heat transfer resistance. The variable heat transfer resistance laid on water cooled permanent magnets (kept between 20 and 40° C. by water circulation).

Graphite crucible could be extra heated by dedicated Joule resistance.

Aimed evaporation rate/total deposition rate ratio was 85% (for constant structure and adhesion without substrate heating). Aimed coating thickness was 0.4 µm.

In order to keep constant coating thickness, deposition rate has to vary inversely proportionally to line speed (because graphite crucible has a constant width).

The tests 4, 5 and 6 are given as comparative tests with respect to the tests 1 to 3 according to the invention.

In tests 4, 5 and 6 heat transfer resistance between crucible and cooled magnets was maximum according to the material and stayed constant (like a standard crucible). Crucible extra heating (by Joule resistance) was off so that the target temperature was a passive balance between heating by plasma and cooling by latent heat of evaporation, target radiation to ambience and heat transfer to cooled magnets.

In this configuration, plasma power density is the only actuator of the deposition rate. As demonstrated, to keep constant thickness with variable line speed plasma power density has to be modulated. This plasma power modulation is correlated with evaporated/sputtered ratio modulation too (ratio changes from 11/89 to 88/12).

On the contrary, in tests 1, 2 and 3 target temperature was regulated through variable heat transfer resistance between crucible and cooled magnet on one hand and extra heating modulation on the other hand in order to keep the ratio evaporation/sputtering constant and equal to 85/15.

| Test N° | Line speed [m/min] | Deposition rate [μm/min] | Plasma power density [W/cm²] | Target T° [K] | Crucible extra heating through Joule resistance [W/cm²] | Heat transfer resistance | Crucible cooling through water cooled magnet [W/cm²] | Ratio evaporation/ sputtering |
|---|---|---|---|---|---|---|---|---|
| 1 | 1.9 | 5.1 | 3.4 | 1333 | 19.2 | max | 18.6 | 85/15 |
| 2 | 15.8 | 44 | 26.8 | 1447 | 0 | max | 20.6 | 85/15 |
| 3 | 17.9 | 49 | 29.9 | 1454 | 0 | lower | 23.3 | 85/15 |
| 4 | 2 | 5.4 | 19.7 | 1244 | 0 | max | 16.9 | 11/89 |
| 5 | 16.1 | 44.1 | 26.8 | 1448 | 0 | max | 20.7 | 85/15 |
| 6 | 19.8 | 54.2 | 27.8 | 1462 | 0 | max | 20.9 | 88/12 |

The table clearly shows that when temperature is not regulated by any variable crucible extra heating or cooling in relation to the plasma power density (when a passive standard crucible cooling is used), evaporation/sputtering ratio will vary with deposition rate.

It is important to emphasize the fact that by keeping evaporation/sputtering ratio constant, there is no need to heat the substrate more than the natural heating during deposition.

For example, in test 3, the substrate temperature stayed close to the ambience temperature (T°<100° C.) and the coating had nevertheless good adhesion.

In Test No. 3, the vapor tension $P_{sn}$ was $5 \times 10^{-3}$ Torr, which allowed the flow of argon, used as inert gas for ionizing, to be cut.

The invention is of course not limited to the form of implementation as described above for the formation of a coating on a substrate and the device represented in the annexed figure, since many variants can be envisioned without going outside the framework of the invention, specifically with regard to the nature of the substrate to be covered, the element of which the coating is formed, the means of thermal regulation, etc.

Thus, in the case where the element is formed of chromium, the element can be present in the solid state and be heated to obtain a sufficiently considerable sublimation of chromium. The chromium can, for example, be introduced into the crucible in the form of granules.

Consequently, within the framework of this invention the term "evaporation" must be understood as the transition to the vapor state starting either from an element in liquid state or one in solid state at the target.

What is claimed is:

1. A continuous process for coating a substrate, comprising:
    continuously moving the substrate according to one direction through at least one enclosure comprising a target having at least one surface layer, the at least one surface layer of the target comprising at least one element,
    maintaining the target at a negative potential in relation to the substrate and a plasma between the at least one surface layer and the substrate, and maintaining the target at a temperature sufficient to enable said at least one element to have a vapor tension in the enclosure giving rise to a transition to a vapor state,
    transiting to a vapor state a first portion of the at least one element of the at least one surface layer to form a vapor that receives the plasma, by controlling the target temperature, and condensing the vapor onto the substrate;
    simultaneously with said transiting to a vapor state and condensing, cathodic sputtering the at least one surface layer of the target to deposit a second portion of the at least one element onto the substrate, by dissipating power density at the target,
    locating a magnetic circuit beneath the target for producing a discharge therefrom having a direction parallel to said moving substrate, so as to maintain the plasma in proximity of said at least one surface layer,
    cooling the magnetic circuit;
    selecting a ratio of said first portion to said second portion of the at least one element within a range from 50/50 to 98/2, for obtaining an optimal adhesion of a coating of said at least one element to the substrate; and
    maintaining the selected ratio under variable conditions of said continuous process for coating said continuously moved substrate, by simultaneously and reciprocally regulating said target temperature and said dissipation of power density at the target.

2. A process according to claim 1, wherein the at least one element is a metal.

3. A process according to claim 1, wherein the target comprises a crucible containing the at least one element in a liquid form, the crucible being located above the cooled magnetic circuit.

4. A process according to claim 1, wherein the target comprises a crucible containing the at least one element in a solid form, the crucible being located above the cooled magnetic circuit.

5. A process according to claim 1, wherein the cooled magnetic circuit is maintained at a temperature ranging from 15° C. to 60° C.

6. A process according to claim 1, wherein the magnetic circuit is supplied with direct current.

7. A process according to claim 1, further comprising maintaining gas pressure between the target and the substrate in excess of 0.002 Torr and not more than 0.5 Torr.

8. A process according to claim 1, wherein said cathodic sputtering is carried out substantially in the absence of an ionized inert gas.

9. A process according to claim 2, wherein the at least one element is selected from the group consisting of tin, aluminum, zinc, chromium, magnesium, manganese and nickel.

10. A process according to claim 1, wherein the moving substrate is maintained at a uniform temperature during the coating.

11. A process according to claim 10, wherein the substrate temperature is lower than 220° C.

* * * * *